US009875712B2

(12) United States Patent
Ma et al.

(10) Patent No.: US 9,875,712 B2
(45) Date of Patent: Jan. 23, 2018

(54) GATE DRIVING CIRCUIT AND DRIVING METHOD THEREOF, AND DISPLAY DEVICE (71) Applicants: BOE Technology Group Co., Ltd., Beijing (CN); Beijing BOE Optoelectronics Technology Co., Ltd., Beijing (CN)

(72) Inventors: Lei Ma, Beijing (CN); Xi Chen, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 0 days.

(21) Appl. No.: 15/314,405

(22) PCT Filed: Apr. 7, 2016

(86) PCT No.: PCT/CN2016/078727
§ 371 (c)(1),
(2) Date: Nov. 28, 2016

(87) PCT Pub. No.: WO2017/000621
PCT Pub. Date: Jan. 5, 2017

(65) Prior Publication Data
US 2017/0178584 A1 Jun. 22, 2017

(30) Foreign Application Priority Data
Jun. 30, 2015 (CN) .......................... 2015 1 0375407

(51) Int. Cl.
G11C 19/00 (2006.01)
G09G 3/36 (2006.01)
G11C 19/28 (2006.01)

(52) U.S. Cl.
CPC ......... G09G 3/3677 (2013.01); G09G 3/3696 (2013.01); G11C 19/28 (2013.01);
(Continued)

(58) Field of Classification Search
None
See application file for complete search history.

(56) References Cited

U.S. PATENT DOCUMENTS

2003/0098838 A1    5/2003  Minami
2008/0079682 A1*   4/2008  Chang .................. G11C 19/287
                                              345/98
(Continued)

FOREIGN PATENT DOCUMENTS

CN    1949038 A    4/2007
CN    101276565 A  10/2008
(Continued)

OTHER PUBLICATIONS

Jun. 28, 2016—International Search Report and Written Opinion Appn PCT/CN2016/078727 with Eng Tran.

Primary Examiner — Tuan T Lam
(74) Attorney, Agent, or Firm — Banner & Witcoff, Ltd.

(57) ABSTRACT

A gate driving circuit and a driving method thereof, and a display device are provided. The gate driving circuit comprises at least two stages of shift register units, and further comprises at least one compensation unit arranged between two adjacent shift register units; a scanning signal output terminal of a first shift register unit is connected to a first signal input terminal of the compensation unit; a first signal output terminal of the compensation unit is connected to a reset signal terminal of the first shift register unit; a scanning signal output terminal of a second shift register unit is connected to a second signal input terminal of the compensation unit; a second signal output terminal of the compensation unit is connected to a control signal input terminal of the second shift register unit; and the compensation unit is further connected to at least one compensation voltage terminal, a first voltage terminal and a second voltage terminal, and is configured to compensate for a gate scanning signal in blanking time. The phenomena of insufficient charging of the pixels caused by increase of the blanking time of the clock signal can be avoided.

18 Claims, 5 Drawing Sheets (52) U.S. Cl.
CPC ........... *G09G 2300/0809* (2013.01); *G09G 2310/0248* (2013.01); *G09G 2310/0286* (2013.01); *G09G 2310/061* (2013.01)

(56) References Cited

U.S. PATENT DOCUMENTS

| | | | | |
|---|---|---|---|---|
| 2015/0302790 | A1* | 10/2015 | Dong | G11C 19/28 345/214 |
| 2015/0318053 | A1* | 11/2015 | Zhang | G09G 3/36 377/64 |
| 2016/0049126 | A1* | 2/2016 | Zhang | G09G 3/3648 345/173 |
| 2017/0102814 | A1* | 4/2017 | Xu | G06F 3/0412 |
| 2017/0124976 | A1* | 5/2017 | Chen | G09G 3/3677 |
| 2017/0153742 | A1* | 6/2017 | Pang | G06F 3/0416 |
| 2017/0178749 | A1* | 6/2017 | Ma | G11C 19/287 |

FOREIGN PATENT DOCUMENTS

| | | | |
|---|---|---|---|
| CN | 101789213 | A | 7/2010 |
| CN | 102414735 | A | 4/2012 |
| CN | 104425034 | A | 3/2015 |
| CN | 104505046 | A | 4/2015 |
| CN | 104900211 | A | 9/2015 |

\* cited by examiner

GATE DRIVING CIRCUIT AND DRIVING METHOD THEREOF, AND DISPLAY DEVICE

The application is a U.S. National Phase Entry of International Application No. PCT/CN2016/078727 filed on Apr. 7, 2016, designating the United States of America and claiming priority to Chinese Patent Application No. 201510375407.7 filed on Jun. 30, 2015. The present application claims priority to and the benefit of the above-identified applications and the above-identified applications are incorporated by reference herein in their entirety.

TECHNICAL FIELD

The present disclosure relates to a gate driving circuit and a driving method thereof, and a display device.

BACKGROUND

Liquid Crystal Display (LCD for short) has been widely used in electronic products such as tablet PCs, TVs or mobile phones for its advantages of low radiation, small size and low power consumption. A display screen of the LCD is provided with pixel cells which are defined by a plurality of gate lines and data lines crossed horizontally and vertically. During the display process, a gate driving circuit can scan the gate lines progressively, and a data driving circuit can charge the pixel cells through the data lines.

In order to further reduce production cost of LCD products, the gate driving circuit in the prior art often adopts a design of Gate Driver on Array (GOA) to integrate a TFT (Thin Film Transistor) gate switching circuit on an array substrate of a display panel. This gate switching circuit integrated on the array substrate by using the GOA technique is also referred to as a GOA circuit or a shift register circuit.

In addition, Touch Screen Panel has also gradually pervaded people's lives. According to composition, the Touch Screen Panel can be divided into: Add on Touch Panel and In Cell Touch Panel. Compared to the Add on Touch Panel, the In Cell Touch Panel refers to integrating a touch screen and a display screen as an entirety, thus it has advantages of being light, thin and low lost.

Typically, the In Cell Touch Panel implements detection of a finger touch position by using the mutual capacitance or self-capacitance principle. Specifically, a mutual capacitive display panel is provided with mutual capacitors composed by touch driving lines (Tx lines) and touch sensing lines (Rx lines) perpendicular to each other. During the touch process, the human body electric field acts on the mutual capacitors, so that capacitance values of the mutual capacitors change. As for acquisition of touch signals in particular, each driving line may be scanned in sequence, then it is measured whether a capacitance value of a mutual capacitor at a certain point where a sensing line is crossed with this driving line changes, so as to obtain an exact contact position.

For known touch display devices, there are mutual interference when the gate lines and the touch driving lines (Tx lines) located in the same row are scanned simultaneously, so scanning of the gate lines and scanning of the touch driving lines (Tx lines) usually are performed in a time-sharing manner. However, as resolutions of display devices continue to increase, the blanking time will be compressed, which results in a reduction in scanning time of the touch driving lines (Tx lines), so that response time of touch signals is not enough, thereby responsiveness speed and sensitivity of Touch Screen Panels are reduced. If the blanking time is prolonged to ensure the response time of touch signals, a voltage at a gate of a driving transistor in the GOA circuit will be leaked by a transistor connected to said gate, thereby the gate scanning signal outputted by the GOA circuit is reduced, which results in insufficient charging of pixel cells, and dark line insufficiency or bright line insufficiency.

SUMMARY

Embodiments of the present disclosure provide a gate driving circuit and a driving method thereof, and a display device, which are capable of solving the problem of insufficient charging of pixel cells caused by prolonging the blanking time.

An aspect of the present disclosure provides a gate driving circuit, comprising at least two stages of shift register units, and further comprising at least one compensation unit arranged between two adjacent shift register units; a scanning signal output terminal of a first shift register unit of the two adjacent shift register units is connected to a first signal input terminal of the compensation unit; a first signal output terminal of the compensation unit is connected to a reset signal terminal of the first shift register unit; a scanning signal output terminal of a second shift register unit of the two adjacent shift register units is connected to a second signal input terminal of the compensation unit; a second signal output terminal of the compensation unit is connected to a control signal input terminal of the second shift register unit; and the compensation unit is further connected to at least one compensation voltage terminal, a first voltage terminal and a second voltage terminal, and is configured to compensate for a gate scanning signal in blanking time.

Optionally, the compensation unit is configured to, under the control of the first voltage terminal, store a signal at the compensation voltage terminal at a first instant of the blanking time, output a signal at the compensation voltage terminal to the reset signal terminal of the first shift register unit at a second instant of the blanking time, and output a signal at the compensation voltage terminal to the control signal input terminal of the second shift register unit at a third instant of the blanking time; or the compensation unit is configured to reset under the control of the second voltage terminal.

Optionally, the compensation unit comprises a control module, a reset module and a voltage holding module; the control module is connected to the reset module, the voltage holding module, the first signal input terminal and the first voltage terminal, respectively, and is configured to output a voltage at the first voltage terminal to the voltage holding module under the control of the first signal input terminal; the reset module is further connected to the voltage holding module, the second signal input terminal and the second voltage terminal, and is configured to output a voltage at the second voltage terminal to the voltage holding module under the control of the second signal input terminal, so as to reset the voltage holding module; and the voltage holding module is further connected to the at least one compensation voltage terminal, the first signal output terminal and the second signal output terminal, and is configured to store a signal at the compensation voltage terminal and output the signal to the first signal output terminal or the second signal output terminal.

Optionally, the control module comprises: a first transistor, a gate of the first transistor being connected to the first signal input terminal, a first electrode of the first transistor being connected to the first voltage terminal, and a second electrode of the first transistor being connected to the reset module and the voltage holding module.

Optionally, the reset module comprises: a second transistor, a gate of the second transistor being connected to the second signal input terminal, a first electrode of the second transistor being connected to the second voltage terminal, and a second electrode of the second transistor being connected to the control module and the voltage holding module.

Optionally, the compensation voltage terminal comprises a first compensation voltage terminal and a second compensation voltage terminal; the voltage holding module comprises a third transistor, a fourth transistor, a first capacitor and a second capacitor; a gate of the third transistor is connected to the control module and the reset module, a first electrode of the third transistor is connected to the first compensation voltage terminal, and a second electrode of the third transistor is connected to the first signal output terminal; a gate of the fourth transistor is connected to the control module and the reset module, a first electrode of the fourth transistor is connected to the second compensation voltage terminal, and a second electrode of the fourth transistor is connected to the second signal output terminal; one terminal of the first capacitor is connected to the gate of the third transistor, and the other terminal of the first capacitor is connected to the second electrode of the third transistor; one terminal of the second capacitor is connected to the gate of the fourth transistor, and the other terminal of the second capacitor is connected to the second electrode of the fourth transistor.

Optionally, the compensation voltage terminal comprises a first compensation voltage terminal and a second compensation voltage terminal; the voltage holding module comprises a fifth transistor, a sixth transistor and a third capacitor; a gate of the fifth transistor is connected to the control module and the reset module, a first electrode of the fifth transistor is connected to the first compensation voltage terminal, and a second electrode of the fifth transistor is connected to the first signal output terminal; a gate of the sixth transistor is connected to the control module and the reset module, a first electrode of the sixth transistor is connected to the second compensation voltage terminal, and a second electrode of the sixth transistor is connected to the second signal output terminal; and one terminal of the third capacitor is connected to the gate of the fifth transistor and the gate of the sixth transistor, and the other terminal of the third capacitor is grounded.

Optionally, the compensation voltage terminal comprises a third compensation voltage terminal; the voltage holding module comprises a seventh transistor and a fourth capacitor; a gate of the seventh transistor is connected to the control module and the reset module, a first electrode of the seventh transistor is connected to the third compensation voltage terminal, and a second electrode of the seventh transistor is connected to the first signal output terminal and the second signal output terminal; one terminal of the fourth capacitor is connected to the gate of the seventh transistor, and the other terminal of the fourth capacitor is connected to the second electrode of the seventh transistor.

Another aspect of the present disclosure provides a display device, comprising any of the gate driving circuit described above.

Yet another aspect of the present disclosure provides a driving method of any the gate driving circuit described above, comprising: a first phase in which the scanning signal output terminal of the first shift register unit outputs a gate scanning signal, and the compensation unit receives the gate scanning signal; a second phase in which the compensation unit, under the control of the first voltage terminal, stores a signal at the compensation voltage terminal at a first instant of the blanking time, outputs a signal at the compensation voltage terminal to the reset signal terminal of the first shift register unit at a second instant of the blanking time, and outputs a signal at the compensation voltage terminal to the control signal input terminal of the second shift register unit at a third instant of the blanking time; a third phase in which the scanning signal output terminal of the second shift register unit outputs a gate scanning signal, and the compensation unit receives the gate scanning signal, and resets under the control of the second voltage terminal.

Optionally, the compensation unit comprises a control module, a reset module and a voltage holding module; and in the second phase, the compensation unit, under the control of the first voltage terminal, stores a signal at the compensation voltage terminal at a first instant of the blanking time, outputs a signal at the compensation voltage terminal to the reset signal terminal of the first shift register unit at a second instant of the blanking time, and outputs a signal at the compensation voltage terminal to the control signal input terminal of the second shift register unit at a third instant of the blanking time comprises: a signal is inputted to the first signal input terminal, the control module is enabled, and a voltage at the first voltage terminal is outputted to the voltage holding module; and a signal is inputted to the compensation voltage terminal, the voltage holding module stores the signal at the compensation voltage terminal and outputs the signal to the first signal output terminal or the second signal output terminal; and a signal is inputted to the second signal input terminal, the reset module is enabled, so that the voltage at the second voltage terminal is outputted to the voltage holding module to reset the voltage holding module.

The embodiments of the present disclosure provide a gate driving circuit and a driving method thereof, and a display device, the gate driving circuit comprises at least two stages of shift register units, and further comprises at least one compensation unit arranged between two adjacent shift register units. A scanning signal output terminal of a first shift register unit of the two adjacent shift register units is connected to a first signal input terminal of the compensation unit, and a first signal output terminal of the compensation unit is connected to a reset signal terminal of the first shift register unit; a scanning signal output terminal of a second shift register unit of the two adjacent shift register units is connected to a second signal input terminal of the compensation unit, and a second signal output terminal of the compensation unit is connected to a control signal input terminal of the second shift register unit; and the compensation unit is further connected to a compensation voltage terminal, a first voltage terminal and a second voltage terminal, and is configured to, under the control of the first voltage terminal, store a signal at the compensation voltage terminal at a first instant of the blanking time, output a signal at the compensation voltage terminal to the reset signal terminal of the first shift register unit at a second instant of the blanking time, and output a signal at the compensation voltage terminal to the control signal input terminal of the second shift register unit at a third instant of the blanking time; or the compensation unit is configured to reset under the control of the second voltage terminal.

In this way, the compensation unit can receive the signal inputted by the scanning signal output terminal of the first shift register unit, and, under the control of the first voltage terminal, store the signal at the compensation voltage terminal and output the signal at the compensation voltage terminal to the reset signal terminal of the first stage of shift register, so as to reset the first shift register unit. In addition, the compensation unit can further output the signal at the compensation voltage terminal to the control signal input terminal of the second shift register unit in the blanking time, so that the second shift register unit can output a gate scanning signal to gate lines connected thereto. Since the compensation unit outputs the voltage provided by the compensation voltage terminal to the second shift register unit in the blanking time, so that it can compensate for the gate scanning signal reduced by prolonging the blanking time, so that the phenomena of insufficient charging of the pixels caused by increase of the blanking time of the clock signal can be avoided. In addition, the compensation unit may be reset through the second voltage terminal, so as to avoid bad affect caused by a residual signal in one frame on a next frame of image.

DETAILED DESCRIPTION OF THE EMBODIMENTS

Hereinafter, the technical solutions in the embodiments of the present disclosure will be described clearly and comprehensively in combination with the drawings thereof, obviously, these described embodiments are parts of the embodiments of the present disclosure, rather than all of the embodiments thereof.

Figure 1:
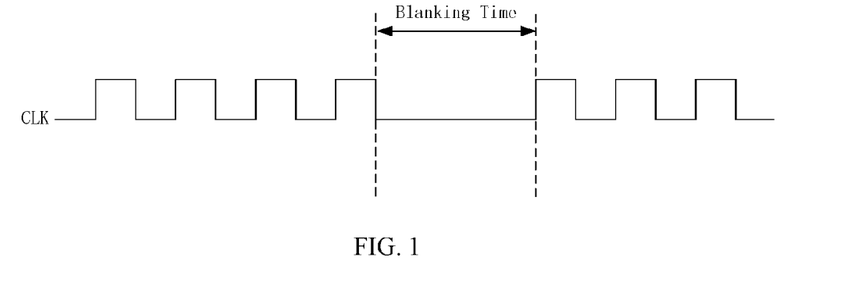
FIG. 1 is a timing diagram of a known clock signal.

FIG. 1 shows a timing diagram of a known clock signal. As shown in FIG. 1, a clock signal CLK of a GOA circuit will have a period of blanking time after one frame of scanning ends, thus the aforesaid blanking time can be used as scanning time of the touch driving lines (Tx lines).

Figure 2:
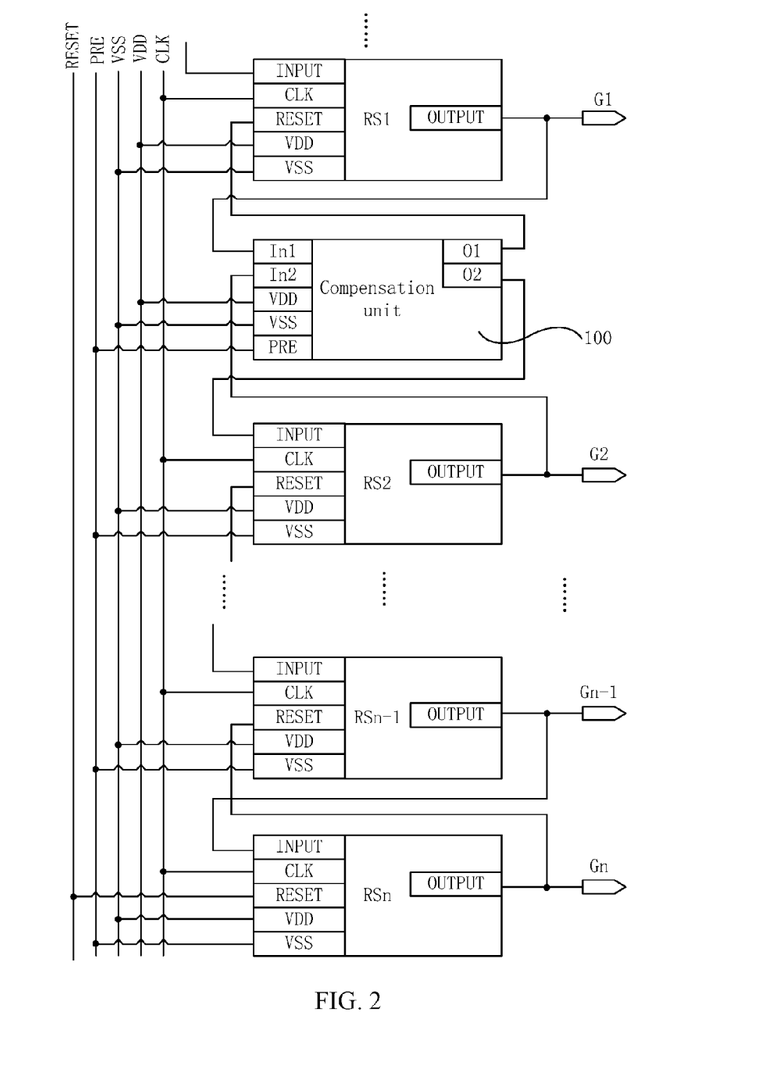
FIG. 2 is a schematic diagram of structure of a gate driving circuit provided by an embodiment of the present disclosure.

FIG. 2 shows a schematic diagram of structure of a gate driving circuit provided by an embodiment of the present disclosure. As shown in FIG. 2, the gate driving circuit may comprise at least two stages of shift register units, and further comprise at least one compensation unit 100 provided between two adjacent shift register units.

The aforesaid two adjacent shift register units may be any two adjacent shift register units in the GOA circuit, for example, a first stage shift register unit RS1 and a second stage shift register unit RS2 shown in FIG. 2, or a reciprocal second stage shift register unit RSn-1 and a last stage shift register unit RSn, n being an integer of larger than or equal to 2. Hereinafter, two adjacent shift register units will be referred to as a first shift register unit and a second shift register unit for the sake of explanation, and in the embodiments of the present disclosure, description is provided all with the first stage shift register unit RS1 shown in FIG. 2 as the first shift register unit and the second stage shift register unit RS2 shown in FIG. 2 as the second shift register unit as an example.

As shown in FIG. 2, a scanning signal output terminal OUTPUT of a first shift register unit RS1 of the two adjacent shift register units is connected to a first signal input terminal In1 of the compensation unit 100. A first signal output terminal O1 of the compensation unit 100 is connected to a reset signal terminal RESET of the first shift register unit RS1.

A scanning signal output terminal OUTPUT of a second shift register unit RS2 of the two adjacent shift register units is connected to a second signal input terminal In2 of the compensation unit 100. A second signal output terminal O2 of the compensation unit 100 is connected to a control signal input terminal INPUT of the second shift register unit RS2.

Figure 5A:
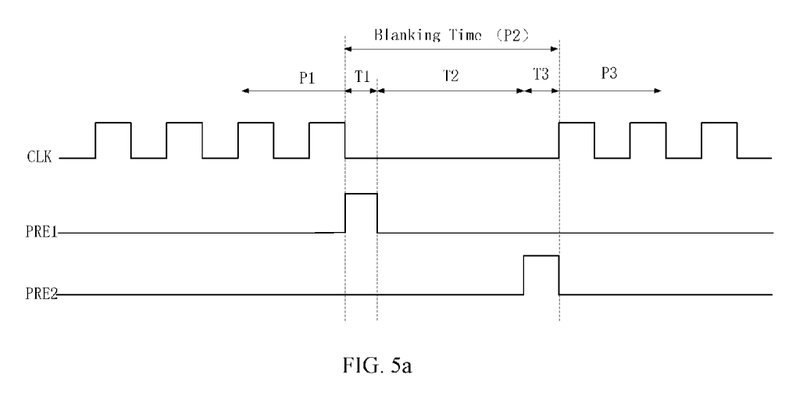
FIG. 5a is a signal timing diagram of controlling the compensation unit in FIG. 4.

The compensation unit 100 is further connected to at least one compensation voltage terminal PRE, a first voltage terminal VDD and a second voltage terminal VSS, and is configured to, under the control of the first voltage terminal VDD, store a signal at the compensation voltage terminal PRE at a first instant T1 of the blanking time, output a signal of the compensation voltage terminal PRE to the reset signal terminal RESET of the first shift register unit RS1 at a second instant T2 of the blanking time, and output a signal of the compensation voltage terminal PRE to the control signal input terminal INPUT of the second shift register unit RS2 at a third instant T3 of the blanking time, as shown in FIG. 5a; or the compensation unit is configured to reset under the control of the second voltage terminal VSS.

It is to be noted that, first, the embodiments of the present disclosure provide description with a high voltage level being inputted to the first voltage terminal VDD and a low voltage level being inputted to the second voltage terminal VSS as an example.

Second, the embodiments of the present disclosure make no limitations to internal structure of the shift register units, as long as they can input a gate scanning signal to the gate lines in the display panel, and the gate driving circuit constituted by the shift register units can implement progressive scanning with respect to all the gate lines on the display panel.

In addition, when structure of the shift register units is different, the number of the clock signal CLK to which the shift register units are connected also is different. The present disclosure makes no limitations to the number of the clock signal CLK, and one clock signal CLK is taken as an example for convenience of explanation.

Third, the embodiments of the present disclosure make no limitations to the number of the compensation units 100, and the compensation unit 100 may be provided between every two adjacent shift register units. In this way, it is possible to compensate for the gate scanning signal outputted from each stage of the shift register units other than the first stage through the compensation unit 100.

Alternatively, in order to save costs, it is not necessary to provide the compensation unit 100 between the every two adjacent shift register units, for example, in FIG. 2, the compensation unit 100 may not be provided between the shift register unit RSn−1 and the last stage shift register unit RSn.

As for two adjacent shift register units between which the compensating unit 100 is not provided, their connection relationship may be that the scanning signal output terminal OUTPUT of a previous stage shift register unit is connected to the control signal input terminal INPUT of a next stage shift register unit, for example, the scanning signal output terminal OUTPUT of the shift register unit RSn−1 is connected to the control signal input terminal INPUT of the shift register unit RSn. The scanning signal output terminal OUTPUT of a next stage shift register unit is connected to the reset signal terminal RESET of a previous stage shift register unit, for example, the scanning signal output terminal OUTPUT of the shift register unit RSn is connected to the reset signal terminal RESET of the shift register unit RSn−1.

The gate driving circuit provided by the embodiment of the present disclosure comprises at least two stages of shift register units, and further comprises at least one compensation unit arranged between two adjacent shift register units. A scanning signal output terminal of a first shift register unit of the two adjacent shift register units is connected to a first signal input terminal of the compensation unit, and a first signal output terminal of the compensation unit is connected to a reset signal terminal of the first shift register unit; a scanning signal output terminal of a second shift register unit of the two adjacent shift register units is connected to a second signal input terminal of the compensation unit, and a second signal output terminal of the compensation unit is connected to a control signal input terminal of the second shift register unit; and the compensation unit is further connected to a compensation voltage terminal, a first voltage terminal and a second voltage terminal, and is configured to, under the control of the first voltage terminal, store a signal at the compensation voltage terminal at a first instant of the blanking time, output a signal of the compensation voltage terminal to the reset signal terminal of the first shift register unit at a second instant of the blanking time, and output a signal of the compensation voltage terminal to the control signal input terminal of the second shift register unit at a third instant of the blanking time; or the compensation unit is configured to reset under the control of the second voltage terminal.

In this way, the compensation unit can receive the signal inputted by the scanning signal output terminal of the first shift register unit, and, under the control of the first voltage terminal, store the signal at the compensation voltage terminal and output the signal at the compensation voltage terminal to the reset signal terminal of the first stage of shift register, so as to reset the first shift register unit. In addition, the compensation unit can further output the signal at the compensation voltage terminal to the control signal input terminal of the second shift register unit in the blanking time, so that the second shift register unit can output a gate scanning signal to gate lines connected thereto. Since the compensation unit outputs the voltage provided by the compensation voltage terminal to the second shift register unit in the blanking time, so that it can compensate for the gate scanning signal reduced by prolonging the blanking time, so that the phenomena of insufficient charging of the pixels caused by increase of the blanking time of the clock signal can be avoided. In addition, the compensation unit may be reset through the second voltage terminal, so as to avoid bad affect caused by a residual signal in the frame on a next frame of image.

Next, specific structure of the compensation unit 100 will be explained in detail.

Figure 3:
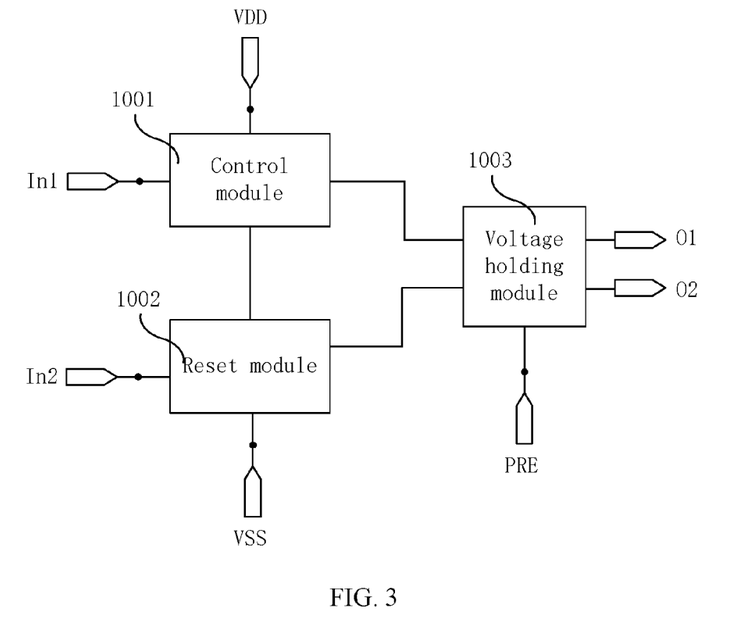
FIG. 3 is a schematic diagram of structure of the compensation unit in FIG. 2.

FIG. 3 shows a schematic diagram of structure of the compensation unit 100 in FIG. 2. As shown in FIG. 3, the compensation unit 100 may comprise a control module 1001, a reset module 1002 and a voltage holding module 1003.

The control module 1001 is connected to the reset module 1002, the voltage holding module 1003, the first signal input terminal In1 and the first voltage terminal VDD, respectively, and is configured to output a voltage at the first voltage terminal VDD to the voltage holding module 1003 under the control of the first signal input terminal In1.

The reset module 1002 is further connected to the voltage holding module 1003, the second signal input terminal In2 and the second voltage terminal VSS, and is configured to output a voltage at the second voltage terminal VSS to the voltage holding module 1003 under the control of the second signal input terminal In2, so as to reset the voltage holding module 1003.

The voltage holding module 1003 is further connected to the at least one compensation voltage terminal PRE, the first signal output terminal O1 and the second signal output terminal O2, and is configured to store a signal at the compensation voltage terminal PRE and output the signal to the first signal output terminal O1 or the second signal output terminal O2.

In this way, the voltage at the first voltage terminal VDD may be outputted to the voltage holding module 1003 through the control module 1001, so as to enable the voltage holding module 1003, and store the signal at the compensation voltage terminal PRE, and output the signal to the first signal output terminal O1 or the second signal output terminal O2, so that the first shift register unit RS1 connected to the first signal output terminal O1 is reset, and the second shift register unit RS2 connected to the second signal output terminal O2 can output the gate scanning signal to the gate lines connected thereto, since the second signal output terminal O2 can provide the signal at the compensation voltage terminal as stored by the voltage holding module 1003 to the second shift register unit RS2 thereby compensating for the gate scanning signal, so that the phenomena of insufficient charging of the pixels caused by increase of the blanking time of the clock signal can be avoided. In addition, the voltage holding module 1003 may be reset through the reset module 1002, so as to avoid bad affect caused by a residual signal in the present frame on a next frame of picture.

Next, specific structures of respective modules in the compensation unit 100 will be illustrated in detail through specific embodiments.

First Embodiment

Figure 4:
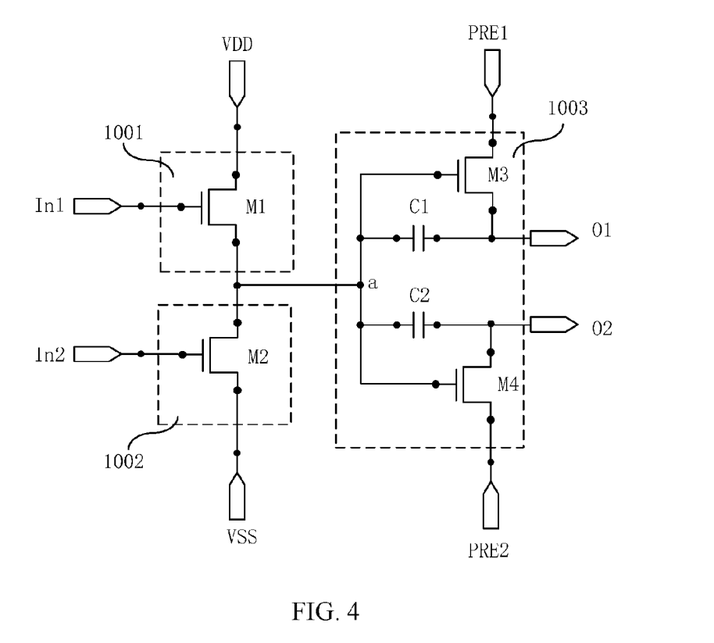
FIG. 4 is a schematic diagram of a specific structure of respective modules in the compensation unit in FIG. 3.

FIG. 4 shows a schematic diagram of a specific structure of respective modules in the compensation unit 100 in FIG. 3. As shown in FIG. 4, the control module 1001 may comprise: a first transistor M1, a gate of the first transistor M1 being connected to the first signal input terminal In1, a first electrode of the first transistor M1 being connected to the first voltage terminal VDD, and a second electrode of the first transistor M1 being connected to the reset module 1002 and the voltage holding module 1003.

The reset module 1002 may comprise: a second transistor M2, a gate of the second transistor M2 being connected to the second signal input terminal In2, a first electrode of the second transistor M2 being connected to the second voltage terminal VSS, and a second electrode of the second transistor M2 being connected to the control module 1001 and the voltage holding module 1003.

The compensation voltage terminal PRE comprises a first compensation voltage terminal PRE1 and a second compensation voltage terminal PRE2; the voltage holding module 1003 may comprise a third transistor M3, a fourth transistor M4, a first capacitor C1 and a second capacitor C2.

A gate of the third transistor M3 is connected to the control module 1001 and the reset module 1002, a first electrode of the third transistor M3 is connected to the first compensation voltage terminal PRE1, and a second electrode of the third transistor M3 is connected to the first signal output terminal O1. When structures of the control module 1001 and the reset module 1002 are as described above, the gate of the third transmission M3 is connected to the second electrode of the first transistor M1 and the second electrode of the second transistor M2.

A gate of the fourth transistor M4 is connected to the control module 1001 and the reset module 1002, a first electrode of the fourth transistor M4 is connected to the second compensation voltage terminal PRE2, and a second electrode of the fourth transistor M4 is connected to the second signal output terminal O2. When structures of the control module 1001 and the reset module 1002 are as described above, the gate of the fourth transmission M4 is connected to the second electrode of the first transistor M1 and the second electrode of the second transistor M2.

One terminal of the first capacitor C1 is connected to the gate of the third transistor M3, and the other terminal of the first capacitor C1 is connected to the second electrode of the third transistor M3.

One terminal of the second capacitor C2 is connected to the gate of the fourth transistor M4, and the other terminal of the second capacitor C2 is connected to the second electrode of the fourth transistor M4.

FIG. 5a shows a signal timing diagram of controlling the compensation unit in FIG. 4. As shown in FIG. 5a, for an In Cell touch display device, a touch operation can be performed in the blanking time when the clock signal terminal outputs the clock signal CLK. And the compensation unit 100 can compensate for the gate scanning signal outputted by the shift register unit in the blanking time, which process is as follows:

At a first instant T1 of the blanking time, the first signal input terminal In1 of the compensation unit 100 receives the gate scanning signal G1 outputted by the first shift register unit RS1 shown in FIG. 2, and the gate scanning signal G1 will be inputted to the gate of the first transistor M1 through the first signal input terminal In1 of the compensation unit 100, the first transistor M1 is turned on, a voltage signal of the first voltage terminal VDD is outputted to a node a, so that a voltage of the node a is Va=VDD. In this case, the third transistor M3 and the fourth transistor M4 are turned on, and the first capacitor C1 and the second capacitor C2 store the voltage signal of the first voltage terminal VDD.

At this time, the signal inputted from the first compensation voltage terminal PRE1 is outputted to the first signal output terminal O1 through the third transistor M3. By a bootstrap action of the first capacitor C1, the voltage at the node a is boosted to Va=VDD+PRE1.

At a second instant T2 of the blanking time, as shown in FIG. 2, the first signal input terminal O1 is connected to the reset signal terminal RESET of the first shift register unit RS1, and when the shift register unit RS1 starts to operate, the signal outputted by the first signal input terminal O1 can reset the first shift register unit RS1, in this case, the voltage at of the node a is boosted to Va=VDD.

At a third instant T3 of the blanking time, since the fourth transistor M4 is turned on, the signal inputted from the second compensation voltage terminal PRE2 is outputted to the second signal output terminal O2 through the fourth transistor M4. By a bootstrap action of the second capacitor C2, the voltage at the node a is boosted to Va=VDD+PRE2. In this case, as shown in FIG. 2, the second signal output terminal O2 is connected to the control signal input terminal INPUT of the second shift register unit RS2, and when the second shift register unit RS2 starts to operate, the signal inputted from the second compensation voltage terminal PRE2 can be outputted to the second shift register unit RS2 through the second signal output terminal O2, so that the second shift register unit RS2 outputs a gate scanning signal to the gate lines connected thereto. In this case, the voltage at the node a is Va=VDD.

To sum up, by means of the second capacitor C2, when the second signal output terminal O2 of the compensating unit 100 outputs a signal to the second shift register unit RS2, the voltage at the node a can be maintained at Va=VDD. In this case, in the blanking time of the clock signal, the fourth transistor M4 can be kept in a turned-on state, and the signal inputted from the second compensation voltage terminal PRE2 is continuously outputted to the control signal input terminal INPUT of the second shift register unit RS2 through the second signal output terminal O2. In this way, even if the blanking time of the clock signal is prolonged to ensure the response time of the touch signal, the second signal output terminal O2 of the compensation unit 100 can continue to input a signal to the control signal input terminal INPUT of the shift register unit connected thereto in the blanking time. In the prior art, no signal is inputted to the control signal input terminal INPUT of the shift register unit in the blanking time, so that the voltage at the gate of said driving transistor of the shift register unit is leaked through the transistor connected to the gate, thereby the gate scanning signal outputted by the GOA circuit is reduced. Therefore, the present disclosure can input a signal to the control signal input terminal INPUT of the shift register unit connected thereto through the compensation unit 100 in the blanking time, so as to compensate for the gate scanning signal outputted by the shift register unit, which avoids the phenomenon of insufficient charging of the pixels.

In addition, after the second scanning shift register unit RS2 as shown in FIG. 2 outputs the gate scanning signal G2, since the scanning signal output terminal OUTPUT of the second shift register unit RS2 is connected to the second signal input terminal In2 of the compensation unit 100, the second transistor M2 can be turned on, so that the voltage signal of the second voltage terminal VSS is outputted to the node a, so as to discharge the first capacitor C1 and the second capacitor C2, which avoids bad affect caused by a residual voltage signal on a next frame of picture.

Figure 5B:
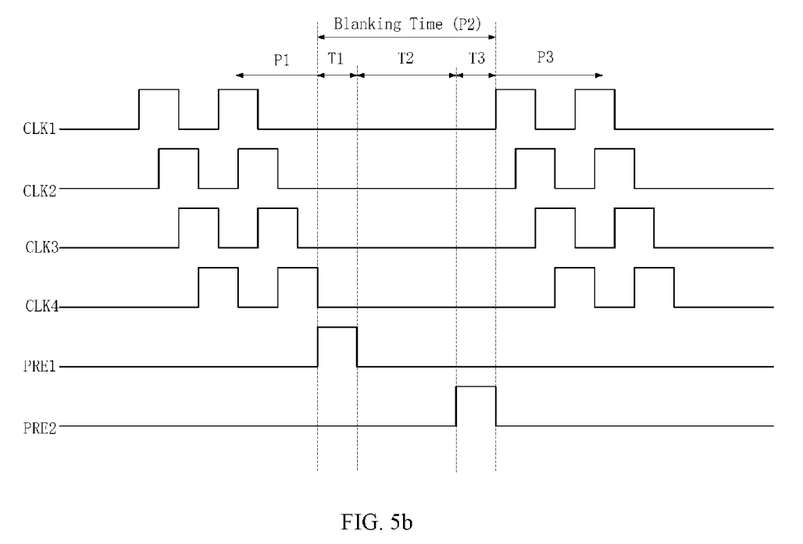
FIG. 5b is another signal timing diagram of controlling the compensation unit in FIG. 4.

It should be noted that, first, the above description is only provided with the GOA circuit adopts one clock signal terminal CLK as an example. Since the embodiments of the present disclosure make no limitations to the number of clock signal terminals to be employed, when a plurality of clock signal terminals are adopted, for example, as shown in FIG. 5b, four clock signal terminals are adopted to output clock signals CLK1, CLK2, CLK3 and CLK4, respectively, in this case, the first compensation voltage terminal PRE1 starts to input signals after all the clock signals enter the blanking time, and the second compensation voltage terminal PRE2 starts to input signals before a moment among all the clock signals that ends the blanking time first. The above description is merely an exemplary description that the first compensation voltage terminal PRE1 and the second compensation voltage terminal PRE2 input signals in a case where the GOA circuit adopts one or four clock signal terminals. When clock signal terminals of other numbers are adopted, how signals are inputted from the first compensation voltage terminal PRE1 and the second compensation voltage terminal PRE2 can be derived likewise, no more details are repeated here.

Second, the transistors in the embodiment are described by taking the N-type transistor as an example. When the P-type transistor is adopted, it is necessary to invert the signals shown in FIGS. 5a and 5b and connect the transistor, to which the first voltage terminal VDD is connected, to the second voltage terminal VSS in the diagram of circuit structure shown in FIG. 4, meanwhile connect the transistor, to which the second voltage terminal VSS is connected, to the first voltage terminal VDD. For convenience of explanation, the transistors in the following embodiments are illustrated by taking the N-type transistor as an example. When the P-type transistor is adopted, a setting manner is the same as that described above.

Second Embodiment

Figure 6:
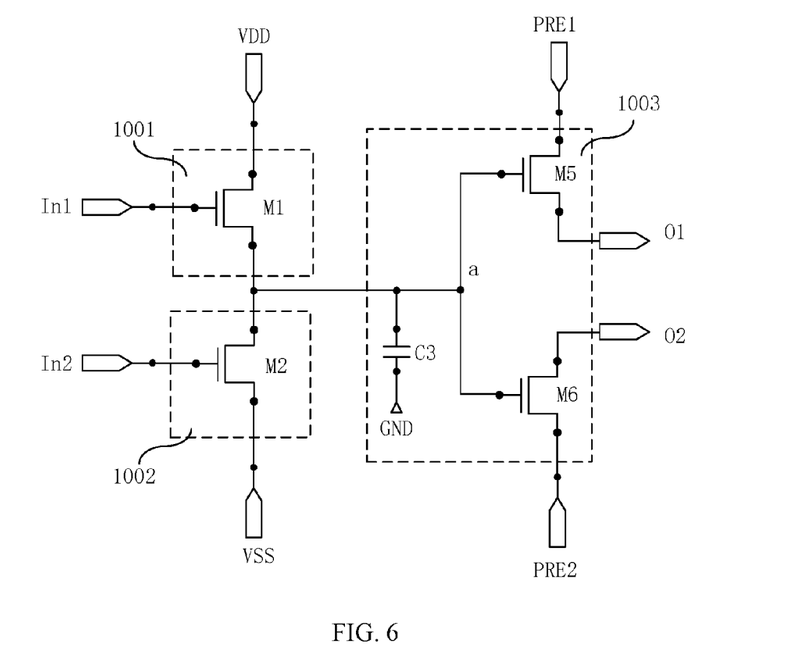
FIG. 6 is a schematic diagram of another specific structure of respective modules in the compensation unit in FIG. 3.

FIG. 6 shows a schematic diagram of another specific structure of respective modules in the compensation unit 100 in FIG. 3. Structures of the control module 1001 and the reset module 1002 in this embodiment are the same as structures of the control module 1001 and the reset module 1002 in the first embodiment. The difference lies in that the compensation voltage terminal comprises a first compensation voltage terminal PRE1 and a second compensation voltage terminal PRE2; the voltage holding module 1003 is as shown in FIG. 6 and may comprise a fifth transistor M5, a sixth transistor M6 and a third capacitor C3.

In FIG. 6, a gate of the fifth transistor M5 is connected to the control module 1001 and the reset module 1002, a first electrode of the fifth transistor M5 is connected to the first compensation voltage terminal PRE1, and a second electrode of the fifth transistor M5 is connected to the first signal output terminal O1. When structures of the control module 1001 and the reset module 1002 are as those described above, the gate of the fifth transistor M5 is connected to the second electrode of the first transistor M1 and the second electrode of the second transistor M2.

A gate of the sixth transistor M6 is connected to the control module 1001 and the reset module 1002, a first electrode of the sixth transistor M6 is connected to the second compensation voltage terminal PRE, and a second electrode of the sixth transistor M6 is connected to the second signal output terminal O2. When structures of the control module 1001 and the reset module 1002 are as those described above, the gate of sixth transistor M6 is connected to the second electrode of the first transistor M1 and the second electrode of the second transistor M2.

One terminal of the third capacitor C3 is connected to the gate of the fifth transistor M5 and the gate of the sixth transistor M6, and the other terminal of the third capacitor C3 is grounded.

In this embodiment, like the principles in the first embodiment, one storage capacitor is adopted, that is, the third capacitor C3, when the first transistor M1 is turned on, the voltage inputted by the first voltage terminal VDD can be stored, so that when the second signal output terminal O2 of the compensation unit 100 outputs a signal to the second shift register unit RS2, the voltage at the node a can be maintained at Va=VDD. In this case, in the blanking time of the clock signal, the sixth transistor M6 can be kept in a turned-on state, and the signal inputted from the second compensation voltage terminal PRE2 is continuously outputted to the control signal input terminal INPUT of the second shift register unit RS2 through the second signal output terminal O2.

Third Embodiment

Figure 7:
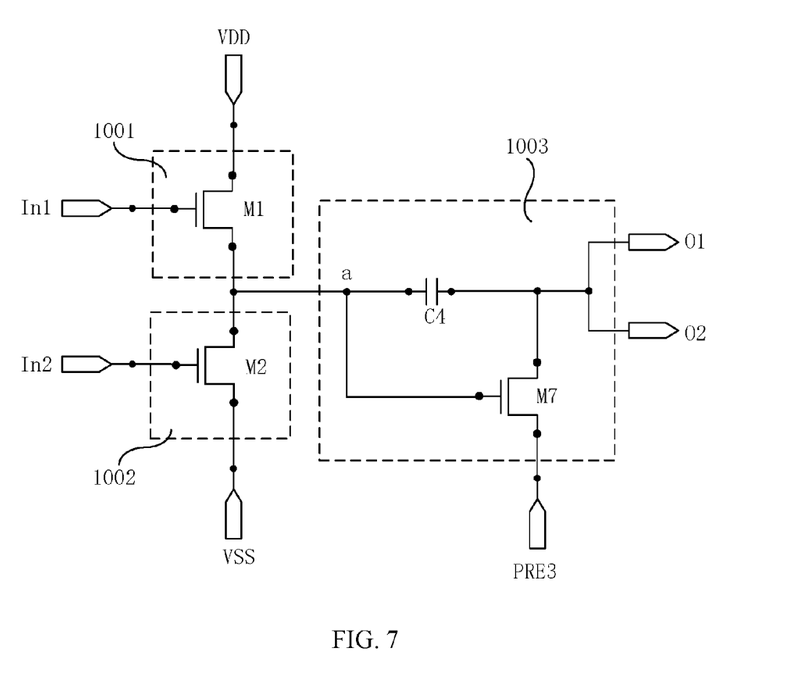
FIG. 7 is a schematic diagram of yet another specific structure of respective modules in the compensation unit in FIG. 3.

FIG. 7 shows a schematic diagram of yet another specific structure of respective modules in the compensation unit 100 in FIG. 3. Structures of the control module 1001 and the reset module 1002 in this embodiment are the same as structures of the control module 1001 and the reset module 1002 in the first embodiment. The difference lies in that at least one compensation voltage terminal is comprised, that is, the third compensation voltage terminal PRE3; the voltage holding module 1003 is as shown in FIG. 7 and may comprise a seventh transistor M7 and a fourth capacitor C4.

A gate of the seventh transistor M7 is connected to the control module 1001 and the reset module 1002, a first electrode of the seventh transistor M7 is connected to the third compensation voltage terminal PRE3, and a second electrode of the seventh transistor M7 is connected to the first signal output terminal O1 and the second signal output terminal O2. When structures of the control module 1001 and the reset module 1002 are as those described above, the gate of the seventh transistor M7 is connected to the second electrode of the first transistor M1 and the second electrode of the second transistor M2.

One terminal of the fourth capacitor C4 is connected to the gate of the seventh transistor M7, and the other terminal of the fourth capacitor C4 is connected to the second electrode of the seventh transistor M7.

Figure 8:
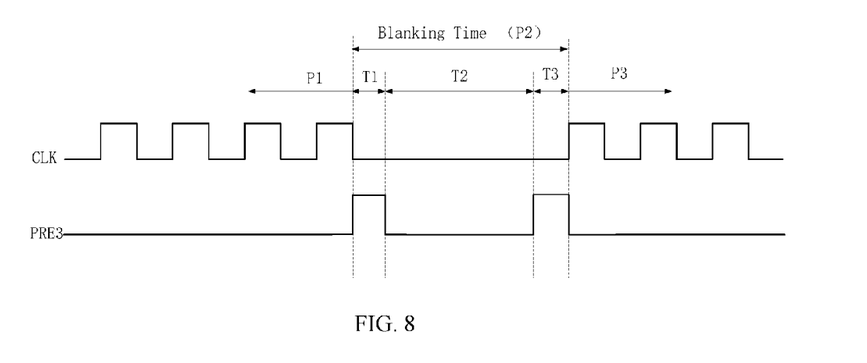
FIG. 8 is a signal timing diagram of controlling the compensation unit in FIG. 7.

FIG. 8 shows a signal timing diagram of controlling the compensation unit in FIG. 7. In FIG. 7, the signal inputted from the third compensation voltage terminal PRE3 is as shown in FIG. 8, in this case, the specific operation process of the compensation unit 100 is as follows:

At a first instant T1 of the blanking time, the first signal input terminal In1 of the compensation unit 100 receives the gate scanning signal G1 outputted by the first shift register unit RS1 shown in FIG. 2, and the gate scanning signal G1 will be inputted to the gate of the first transistor M1 through the first signal input terminal In1 of the compensation unit 100, the first transistor M1 is turned on, a voltage signal of the first voltage terminal VDD is outputted to a node a, so that a voltage Va of the node a is Va=VDD. In this case, the seventh transistor M7 is turned on, and the fourth capacitor C4 stores the voltage signal of the first voltage terminal VDD.

At this time, the signal inputted from the third compensation voltage terminal PRE3 is outputted to the first signal output terminal O1 through the seventh transistor M7. By a bootstrap action of the fourth capacitor C4, the voltage at the node a is boosted to Va=VDD+PRE3.

At a second instant T2 of the blanking time, as shown in FIG. 2, the first signal input terminal O1 is connected to the reset signal terminal RESET of the first shift register unit RS1, and when the shift register unit RS1 starts to operate, the signal outputted by the first signal input terminal O1 can reset the first shift register unit RS1, in this case, the voltage at of the node a is boosted to Va=VDD.

At a third instant T3 of the blanking time, since the seventh transistor M7 is turned on, the signal inputted from the third compensation voltage terminal PRE3 is outputted to the second signal output terminal O2 through the seventh transistor M7. By a bootstrap action of the fourth capacitor C4, the voltage at the node a is boosted to Va=VDD+PRE3. In this case, as shown in FIG. 2, the second signal output terminal O2 is connected to the control signal input terminal INPUT of the second shift register unit RS2, and when the second shift register unit RS2 starts to operate, the signal inputted from the third compensation voltage terminal PRE3 can be outputted to the second shift register unit RS2 through the second signal output terminal O2, so that the second shift register unit RS2 outputs a gate scanning signal to the gate lines connected thereto. In this case, the voltage at the node a is Va=VDD.

To sum up, by means of the fourth capacitor C4, when the second signal output terminal O2 of the compensating unit 100 outputs a signal to the second shift register unit RS2, the voltage at the node a can be maintained at Va=VDD. In this case, in the blanking time of the clock signal, the seventh transistor M7 can be kept in a turned-on state, and the signal inputted from the third compensation voltage terminal PRE3 is continuously outputted to the control signal input terminal INPUT of the second shift register unit RS2 through the second signal output terminal O2.

To sum up, in the three embodiments described above, relatively speaking, structure in the third embodiment shown in FIG. 7 is simpler, thus it facilitates reducing power consumption and space occupied by the circuit.

Another aspect of the present disclosure provides a display device, comprising any of the gate driving circuits described above, and said display device has the same structures and advantageous effects of the gate driving circuits provided in the above embodiments. Since the above embodiments have already described the structures and advantageous effects of the gate driving circuits in detail, no more details are repeated here.

In the embodiments of the present disclosure, the display device may specifically comprise a liquid crystal display device, the display device may, for example, be any product or component having a display function such as a liquid crystal display, a liquid crystal television, a digital photo frame, a mobile phone, or a tablet computer.

Figure 9:
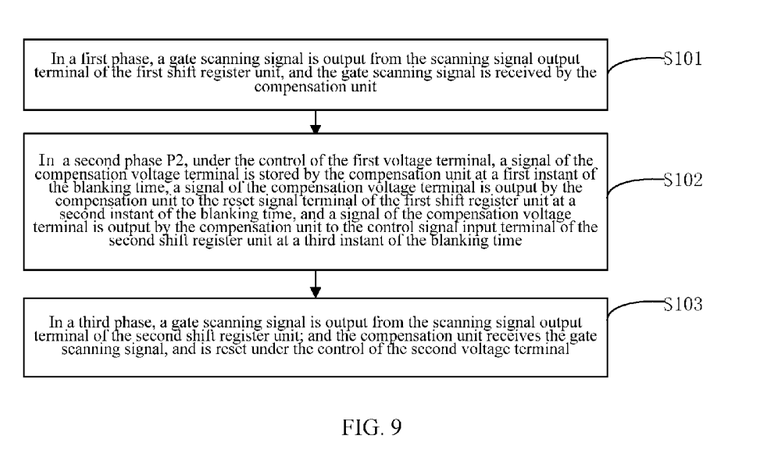
FIG. 9 is a flowchart of a driving method of a gate driving circuit provided by an embodiment of the present disclosure.

FIG. 9 shows a flowchart of a driving method of a gate driving circuit provided by an embodiment of the present disclosure. As shown in FIG. 9, a driving method of the gate driving circuit provided by an embodiment of the present disclosure may comprise the following operation process:

In step S101, in a first phase P1 shown in FIG. 5a, the scanning signal output terminal OUTPUT of the first shift register unit RS1 outputs a gate scanning signal G1, and the compensation unit 100 receives the gate scanning signal G1 through the first signal input terminal In1.

In step S102, in a second phase P2 (i.e., the blanking time), under the control of the first voltage terminal VDD, a signal at the compensation voltage terminal PRE is stored by the compensation unit 100 at a first instant T1 of the blanking time, the signal at the compensation voltage terminal PRE is output by the compensation unit 100 to the reset signal terminal RESER of the first shift register unit TS1 at a second instant T2 of the blanking time, and the signal at the compensation voltage terminal PRE is output by the compensation unit 100 to the control signal input terminal INPUT of the second shift register unit RS2 at a third instant T3 of the blanking time. Therefore, the voltage at the compensation voltage terminal can be output by the compensation unit to the second shift register unit in the blanking time so as to compensate for the gate scanning signal.

In step S103, in a third phase P3, the scanning signal output terminal OUTPUT of the second shift register unit RS2 outputs a gate scanning signal G2. The compensation unit 100 receives the gate scanning signal G2, and resets under the control of the second voltage terminal VSS. Accordingly, bad affect caused by a residual signal in one frame on a next frame of image can be avoided.

The driving method of the gate driving circuit provided by the embodiment of the present disclosure comprises, first, in the first phase, a gate scanning signal is output from the scanning signal output terminal of the first shift register unit, and the gate scanning signal is received by the compensation unit; next, in the second phase, under the control of the first voltage terminal, the signal at the compensation voltage terminal is stored by the compensation unit at the first instant of the blanking time; the signal at the compensation voltage terminal is output by the compensation unit to the reset signal terminal of the first shift register at the second instant of the blanking time; and the signal at the compensation voltage terminal is output by the compensation unit to the control signal input terminal of the second shift register unit; and last, the gate scanning signal is output from the scanning signal output terminal of the second shift register unit, the compensation unit receives the gate scanning signal and is reset under the control of the second voltage terminal.

In this way, the compensation unit can receive the signal inputted by the scanning signal output terminal of the first shift register unit, and, under the control of the first voltage terminal, store the signal at the compensation voltage terminal and output the signal at the compensation voltage terminal to the reset signal terminal of the first shift register, so as to reset the first shift register unit. In addition, the compensation unit can further output the signal at the compensation voltage terminal to the control signal input terminal of the second shift register unit in the blanking time, so that the second shift register unit can output a gate scanning signal to gate lines connected thereto. Since the compensation unit outputs the voltage provided by the compensation voltage terminal to the second shift register unit in the blanking time, so that it can compensate for the gate scanning signal reduced by prolonging the blanking time, thereby the phenomena of insufficient charging of the pixels caused by increase of the blanking time of the clock signal can be avoided. In addition, the compensation unit may be reset through the second voltage terminal, so as to avoid bad affect caused by a residual signal in one frame on a next frame of image.

When the compensation unit 100 comprises the control module 1001, the reset module 1002 and the voltage holding module 1003, the step S102 may comprise:

First, a signal is inputted to the first signal input terminal In1, the control module 1001 is turned on to output the voltage of the first voltage terminal VDD to the voltage holding module 1003.

For example, when structures of the control module 1001, the reset module 1002 and the voltage holding module 1003 are as shown in FIG. 4, the first signal input terminal In1 of the compensation unit 100 receives the gate scanning signal G1 outputted by the first shift register unit RS1, the gate scanning signal G1 will be inputted to the gate of the first transistor M1 through the first signal input terminal In1 of the compensating unit 100, the first transistor M1 is turned on, and the voltage signal of the first voltage terminal VDD is outputted to the node a, so that the voltage Va at node a is Va=VDD. In this case, the third transistor M3 and the fourth transistor M4 are turned on, and the first capacitor C1 and the second capacitor C2 store the voltage signal of the first voltage terminal VDD.

Next, a signal is inputted from the compensation voltage terminal PRE, the voltage holding module 1003 stores the signal of the compensation voltage terminal PRE and outputs the signal to the first signal output terminal O1 or the second signal output terminal O2.

For example, at the first instant T1 of the blanking time, the signal inputted from the first compensation voltage terminal PRE1 is outputted to the first signal output terminal O1 through the third transistor M3.

At the second instant T2 of the blanking time, as shown in FIG. 2, the first signal output terminal O1 is connected to the reset signal terminal RESET of the first shift register unit RS1, when the shift register unit RS1 starts to operate, the signal outputted from the first signal input terminal O1 can reset the first shift register unit RS1.

At the third instant T3 of the blanking time, since the fourth transistor M4 is turned on, the signal inputted from the second compensation voltage terminal PRE2 is outputted to the second signal output terminal O2 through the fourth transistor M4. By a bootstrap action of the second capacitor C2, the voltage at the node a is boosted to Va=VDD+PRE2. In this case, as shown in FIG. 2, the second signal output terminal O2 is connected to the control signal input terminal INPUT of the second shift register unit RS2, when the second shift register unit RS2 starts to operate, the signal inputted from the second compensation voltage terminal PRE2 can be outputted to the second shift register unit RS2 through the second signal output terminal O2, so that the second shift register unit RS2 outputs a gate scanning signal to the gate line connected thereto.

Finally, a signal is inputted to the second signal input terminal In2, the reset module 1002 is enabled, to output the voltage of the second voltage terminal VSS to the voltage holding module 1003, and thereby reset the voltage holding module 1003.

For example, after the second shift register unit RS2 shown in FIG. 2 outputs the gate scanning signal G2, since the scanning signal output terminal OUTPUT of the second shift register unit RS2 and the second signal input terminal In2 of the compensation unit 100 are connected, so that the second transistor M2 can be turned on, to cause the voltage signal of the second voltage terminal VSS to be outputted to the node a, so as to discharge the first capacitor C1 and the second capacitor C2, accordingly, bad affect caused by a residual signal on a next frame of image can be avoided.

The above described merely are specific implementations of the present disclosure, but the protection scope of the present disclosure is not limited thereto, modification and replacements easily conceivable for those skilled in the art within the technical range revealed by the present disclosure all fall into the protection scope of the present disclosure. Therefore, the protection scope of the present disclosure is based on the protection scope of the claims.

The present application claims priority of the Chinese Patent Application No. 201510375407.7 filed on Jun. 30, 2015, the entire disclosure of which is hereby incorporated in full text by reference as part of the present application.

What is claimed is:

1. A gate driving circuit, comprising at least two stages of shift register units, and further comprising at least one compensation unit arranged between two adjacent shift register units;
    a scanning signal output terminal of a first shift register unit of the two adjacent shift register units is connected to a first signal input terminal of the compensation unit, and a reset signal terminal of the first shift register unit is connected to a first signal output terminal of the compensation unit;
    a scanning signal output terminal of a second shift register unit of the two adjacent shift register units is connected to a second signal input terminal of the compensation unit, and a control signal input terminal of the second shift register unit is connected to a second signal output terminal of the compensation unit; and
    the compensation unit is further connected to at least one compensation voltage terminal, a first voltage terminal and a second voltage terminal, and is configured to compensate for a gate scanning signal in blanking time.

2. The gate driving circuit according to claim 1, wherein the compensation unit, under the control of the first voltage terminal, stores a signal at the compensation voltage terminal at a first instant of the blanking time, outputs a signal at the compensation voltage terminal to the reset signal terminal of the first shift register unit at a second instant of the blanking time, and outputs a signal at the compensation voltage terminal to the control signal input terminal of the second shift register unit at a third instant of the blanking time; or the compensation unit is reset under the control of the second voltage terminal.

3. The gate driving circuit according to claim 1, wherein the compensation unit comprises a control module, a reset module and a voltage holding module;
    the control module is connected to the reset module, the voltage holding module, the first signal input terminal and the first voltage terminal, respectively, and is configured to output a voltage of the first voltage terminal to the voltage holding module under the control of the first signal input terminal;
    the reset module is further connected to the voltage holding module, the second signal input terminal and the second voltage terminal, and is configured to output a voltage of the second voltage terminal to the voltage holding module under the control of the second signal input terminal, so as to reset the voltage holding module; and
    the voltage holding module is further connected to the at least one compensation voltage terminal, the first signal output terminal and the second signal output terminal, and is configured to store a signal of the compensation voltage terminal and output the signal to the first signal output terminal or the second signal output terminal.

4. The gate driving circuit according to claim 3, wherein the control module comprises:
    a first transistor, a gate of the first transistor being connected to the first signal input terminal, a first electrode of the first transistor being connected to the first voltage terminal, and a second electrode of the first transistor being connected to the reset module and the voltage holding module.

5. The gate driving circuit according to claim 3, wherein the reset module comprises:
    a second transistor, a gate of the second transistor being connected to the second signal input terminal, a first electrode of the second transistor being connected to the second voltage terminal, and a second electrode of the second transistor being connected to the control module and the voltage holding module.

6. The gate driving circuit according to claim 3, wherein the compensation voltage terminal comprises a first compensation voltage terminal and a second compensation voltage terminal; and the voltage holding module comprises a third transistor, a fourth transistor, a first capacitor and a second capacitor;
    a gate of the third transistor is connected to the control module and the reset module, a first electrode of the third transistor is connected to the first compensation voltage terminal, and a second electrode of the third transistor is connected to the first signal output terminal;

a gate of the fourth transistor is connected to the control module and the reset module, a first electrode of the fourth transistor is connected to the second compensation voltage terminal, and a second electrode of the fourth transistor is connected to the second signal output terminal;

one terminal of the first capacitor is connected to the gate of the third transistor, and the other terminal of the first capacitor is connected to the second electrode of the third transistor;

one terminal of the second capacitor is connected to the gate of the fourth transistor, and the other terminal of the second capacitor is connected to the second electrode of the fourth transistor.

7. The gate driving circuit according to claim 3, wherein the compensation voltage terminal comprises a first compensation voltage terminal and a second compensation voltage terminal; and the voltage holding module comprises a fifth transistor, a sixth transistor and a third capacitor;

a gate of the fifth transistor is connected to the control module and the reset module, a first electrode of the fifth transistor is connected to the first compensation voltage terminal, and a second electrode of the fifth transistor is connected to the first signal output terminal;

a gate of the sixth transistor is connected to the control module and the reset module, a first electrode of the sixth transistor is connected to the second compensation voltage terminal, and a second electrode of the sixth transistor is connected to the second signal output terminal; and one terminal of the third capacitor is connected to the gate of the fifth transistor and the gate of the sixth transistor, and the other terminal of the third capacitor is grounded.

8. The gate driving circuit according to claim 3, wherein the compensation voltage terminal comprises a third compensation voltage terminal; the voltage holding module comprises a seventh transistor and a fourth capacitor;

a gate of the seventh transistor is connected to the control module and the reset module, a first electrode of the seventh transistor is connected to the third compensation voltage terminal, and a second electrode of the seventh transistor is connected to the first signal output terminal and the second signal output terminal;

one terminal of the fourth capacitor is connected to the gate of the seventh transistor, and the other terminal of the fourth capacitor is connected to the second electrode of the seventh transistor.

9. A display device, comprising the gate driving circuit according to claim 1.

10. A driving method of the gate driving circuit according to claim 1, comprising:

a first phase in which a gate scanning signal is output from the scanning signal output terminal of the first shift register unit, and the gate scanning signal is received by the compensation unit;

a second phase in which under the control of the first voltage terminal, a signal of the compensation voltage terminal is stored by the compensation unit at a first instant of the blanking time, a signal of the compensation voltage terminal is output by the compensation unit to the reset signal terminal of the first shift register unit at a second instant of the blanking time, and a signal of the compensation voltage terminal is output by the compensation unit to the control signal input terminal of the second shift register unit at a third instant of the blanking time;

a third phase in which a gate scanning signal is output from the scanning signal output terminal of the second shift register unit; and the compensation unit receives the gate scanning signal, and is reset under the control of the second voltage terminal.

11. The driving method of the gate driving circuit according to claim 10, wherein the compensation unit comprises a control module, a reset module and a voltage holding module; and in the second phase, the compensation unit, under the control of the first voltage terminal, stores a signal at the compensation voltage terminal at a first instant of the blanking time, outputs a signal at the compensation voltage terminal to the reset signal terminal of the first shift register unit at a second instant of the blanking time, and outputs a signal at the compensation voltage terminal to the control signal input terminal of the second shift register unit at a third instant of the blanking time comprises:

a signal is inputted to the first signal input terminal, the control module is enabled, and a voltage at the first voltage terminal is outputted to the voltage holding module; and a signal is inputted to the compensation voltage terminal, the voltage holding module stores the signal at the compensation voltage terminal and outputs the signal to the first signal output terminal or the second signal output terminal; and a signal is inputted to the second signal input terminal, the reset module is enabled, so that the voltage at the second voltage terminal is outputted to the voltage holding module to reset the voltage holding module.

12. The display device according to claim 9, wherein the compensation unit, under the control of the first voltage terminal, stores a signal at the compensation voltage terminal at a first instant of the blanking time, outputs a signal at the compensation voltage terminal to the reset signal terminal of the first shift register unit at a second instant of the blanking time, and outputs a signal at the compensation voltage terminal to the control signal input terminal of the second shift register unit at a third instant of the blanking time; or the compensation unit is reset under the control of the second voltage terminal.

13. The display device according to claim 9, wherein the compensation unit comprises a control module, a reset module and a voltage holding module;

the control module is connected to the reset module, the voltage holding module, the first signal input terminal and the first voltage terminal, respectively, and is configured to output a voltage of the first voltage terminal to the voltage holding module under the control of the first signal input terminal;

the reset module is further connected to the voltage holding module, the second signal input terminal and the second voltage terminal, and is configured to output a voltage of the second voltage terminal to the voltage holding module under the control of the second signal input terminal, so as to reset the voltage holding module; and the voltage holding module is further connected to the at least one compensation voltage terminal, the first signal output terminal and the second signal output terminal, and is configured to store a signal of the compensation voltage terminal and output the signal to the first signal output terminal or the second signal output terminal.

14. The display device according to claim 13, wherein the control module comprises:
a first transistor, a gate of the first transistor being connected to the first signal input terminal, a first electrode of the first transistor being connected to the first voltage terminal, and a second electrode of the first transistor being connected to the reset module and the voltage holding module.

15. The display device according to claim 13, wherein the reset module comprises:
a second transistor, a gate of the second transistor being connected to the second signal input terminal, a first electrode of the second transistor being connected to the second voltage terminal, and a second electrode of the second transistor being connected to the control module and the voltage holding module.

16. The display device according to claim 13, wherein the compensation voltage terminal comprises a first compensation voltage terminal and a second compensation voltage terminal; and the voltage holding module comprises a third transistor, a fourth transistor, a first capacitor and a second capacitor;
a gate of the third transistor is connected to the control module and the reset module, a first electrode of the third transistor is connected to the first compensation voltage terminal, and a second electrode of the third transistor is connected to the first signal output terminal;
a gate of the fourth transistor is connected to the control module and the reset module, a first electrode of the fourth transistor is connected to the second compensation voltage terminal, and a second electrode of the fourth transistor is connected to the second signal output terminal;
one terminal of the first capacitor is connected to the gate of the third transistor, and the other terminal of the first capacitor is connected to the second electrode of the third transistor;
one terminal of the second capacitor is connected to the gate of the fourth transistor, and the other terminal of the second capacitor is connected to the second electrode of the fourth transistor.

17. The display device according to claim 13, wherein the compensation voltage terminal comprises a first compensation voltage terminal and a second compensation voltage terminal; and the voltage holding module comprises a fifth transistor, a sixth transistor and a third capacitor;
a gate of the fifth transistor is connected to the control module and the reset module, a first electrode of the fifth transistor is connected to the first compensation voltage terminal, and a second electrode of the fifth transistor is connected to the first signal output terminal;
a gate of the sixth transistor is connected to the control module and the reset module, a first electrode of the sixth transistor is connected to the second compensation voltage terminal, and a second electrode of the sixth transistor is connected to the second signal output terminal; and
one terminal of the third capacitor is connected to the gate of the fifth transistor and the gate of the sixth transistor, and the other terminal of the third capacitor is grounded.

18. The display device according to claim 13, wherein the compensation voltage terminal comprises a third compensation voltage terminal; the voltage holding module comprises a seventh transistor and a fourth capacitor;
a gate of the seventh transistor is connected to the control module and the reset module, a first electrode of the seventh transistor is connected to the third compensation voltage terminal, and a second electrode of the seventh transistor is connected to the first signal output terminal and the second signal output terminal;
one terminal of the fourth capacitor is connected to the gate of the seventh transistor, and the other terminal of the fourth capacitor is connected to the second electrode of the seventh transistor.

* * * * *